United States Patent
Tran et al.

(10) Patent No.: US 7,260,296 B2
(45) Date of Patent: Aug. 21, 2007

(54) MEASURING THE POSITION OF PASSIVELY ALIGNED OPTICAL COMPONENTS

(75) Inventors: Ut Tran, San Jose, CA (US); Hamid R. Eslampour, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/392,018

(22) Filed: Mar. 29, 2006

(65) Prior Publication Data

US 2006/0182395 A1 Aug. 17, 2006

Related U.S. Application Data

(62) Division of application No. 11/174,940, filed on Jul. 5, 2005, now Pat. No. 7,050,682, which is a division of application No. 10/609,804, filed on Jun. 30, 2003, now Pat. No. 6,959,134.

(51) Int. Cl.
*G02B 6/26* (2006.01)
*G02B 6/12* (2006.01)

(52) U.S. Cl. .......................................... 385/52; 385/14
(58) Field of Classification Search .................. 385/14, 385/50–52, 147
See application file for complete search history.

(56) References Cited

U.S. PATENT DOCUMENTS

| | | | |
|---|---|---|---|
| 6,959,134 B2 * | 10/2005 | Tran et al. | 385/52 |
| 6,961,505 B2 * | 11/2005 | Suzuki et al. | 385/137 |
| 7,050,682 B2 * | 5/2006 | Tran et al. | 385/52 |

* cited by examiner

*Primary Examiner*—Quyen Leung
(74) *Attorney, Agent, or Firm*—Trop, Pruner & Hu, P.C.

(57) ABSTRACT

Optical components may be precisely positioned in three dimensions with respect to one another. A bonder which has the ability to precisely position the components in two dimensions can be utilized. The components may be equipped with contacts at different heights so that as the components come together in a third dimension, their relative positions can be sensed. This information may be fed back to the bonder to control the precise alignment in the third dimension.

4 Claims, 4 Drawing Sheets

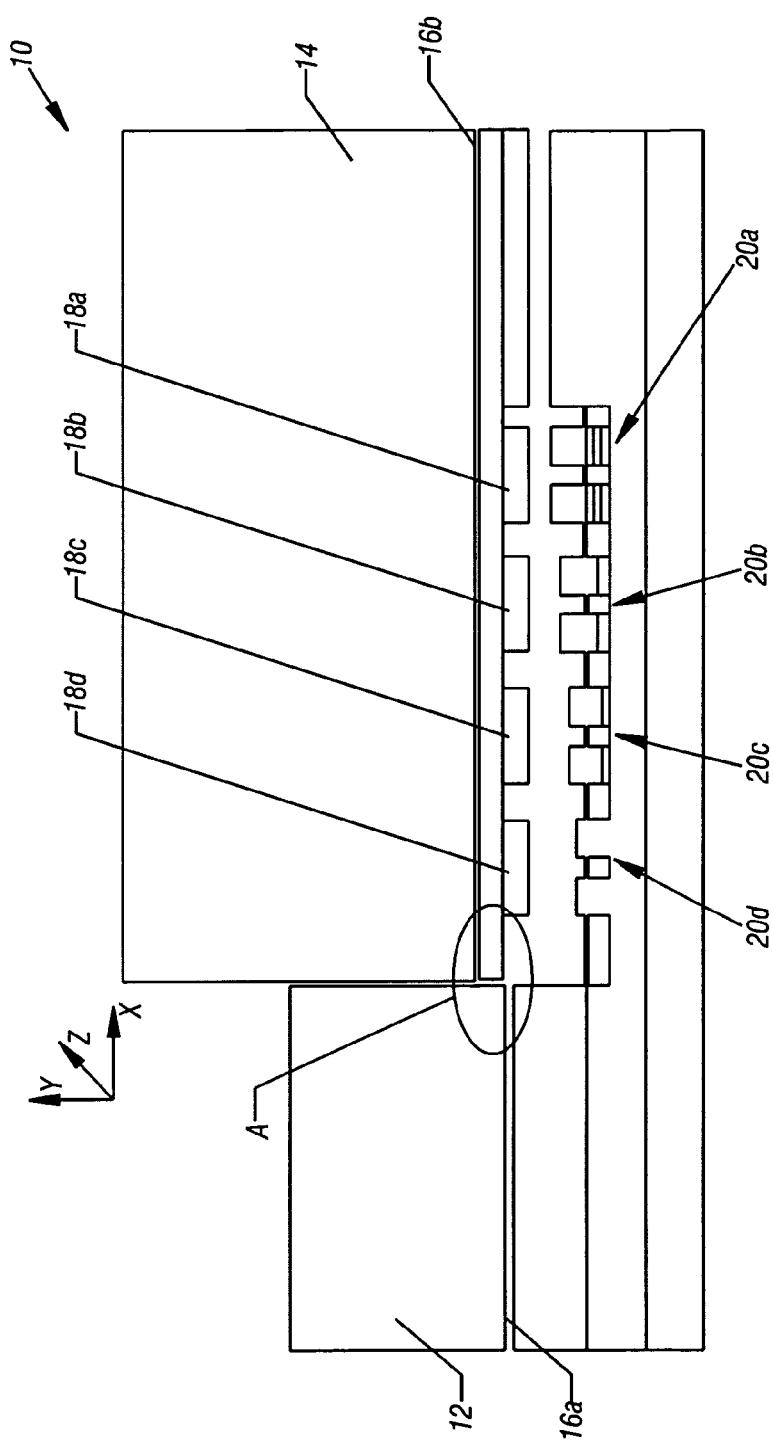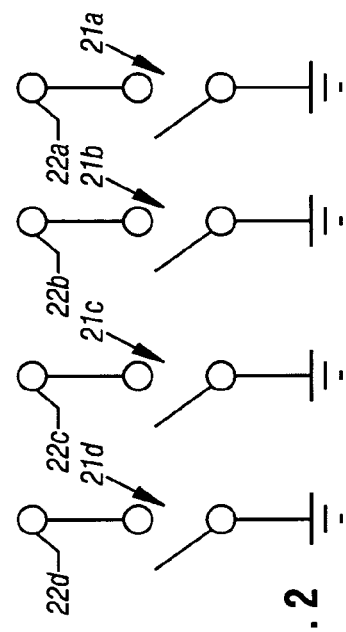

MEASURING THE POSITION OF PASSIVELY ALIGNED OPTICAL COMPONENTS

CROSS-REFERENCE TO RELATED APPLICATIONS

This application is a divisional of U.S. patent application Ser. No. 11/174,940, filed on Jul. 5, 2005, now U.S. Pat. No. 7,050,682 which is a divisional of U.S. patent application Ser. No. 10/609,804, filed on Jun. 30, 2003, which issued as U.S. Pat. No. 6,959,134.

BACKGROUND

This invention relates generally to the assembly of components for optical communication networks.

In optical networks, a number of components may be placed on a structure, such as an optical bench or a planar lightwave circuit. It is advantageous to precisely position these structures using high precision flip chip bonders. However, such bonders are only able to provide alignment in the X and Z coordinates, which basically exist in a plane corresponding to the plane of the optical bench or the planar lightwave circuit.

These bonders do not control the positioning in the transverse or Y direction normal to the surface of the bench or circuit. Unfortunately, optical coupling efficiency between components is also highly dependent on the Y-height placement. However, the present inventors know of no methodology or tooling to address the Y-height placement aspect.

Thus, there is a need for better ways to provide alignment operations for building passive optical devices.

BRIEF DESCRIPTION OF THE DRAWINGS

FIG. 1 is an enlarged, cross-sectional view of one embodiment of the present invention;

FIG. 2 is a schematic depiction of the embodiment shown in FIG. 1;

DETAILED DESCRIPTION

Figure 3:
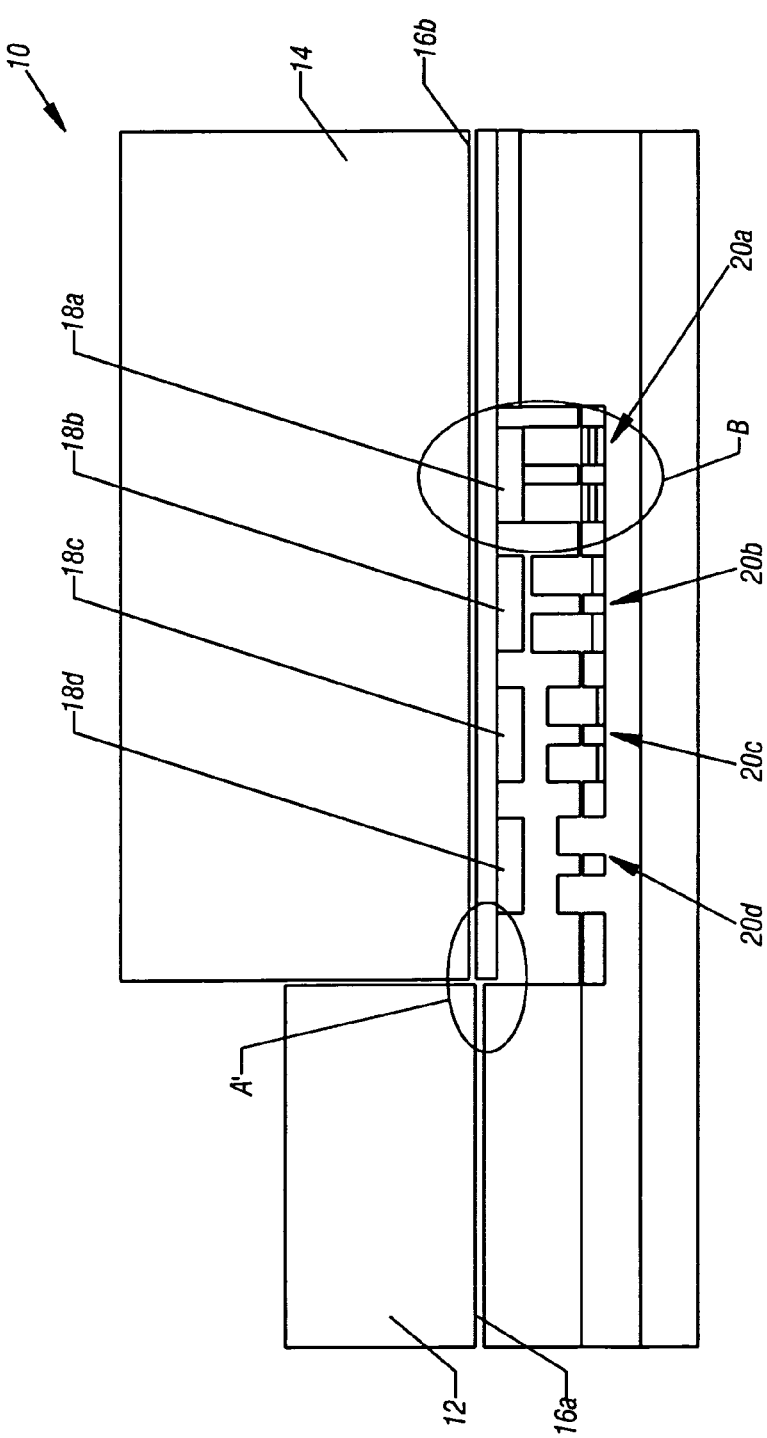
FIG. 3 is an enlarged, cross-sectional depiction of another embodiment of the present invention.

Referring to FIG. 1, an optical amplifier 14 may be positioned on a silicon optical bench or planar lightwave circuit 12 in one embodiment of the present invention. The bench 12 may be L-shaped in cross section in one embodiment of the present invention. The bench 12 and the optical amplifier 14 may each have a part 16a, 16b of a waveguide 16 that ultimately needs to be aligned. Thus, it is desirable to use a high precision flip chip bonder or other chip placement tool to position the amplifier 14 precisely on the bench 12 so that the portion 16a of the waveguide lines up with the portion 16b of the waveguide on the separate bench 12 and amplifier 14.

Though the present description speaks of amplifiers and benches, the present invention is applicable to aligning and positioning any optical component with respect to any other optical component. Thus, the discussion of optical amplifiers and benches is merely meant as an illustrative example.

The amplifier 14 may have a bonding pad 18 including a plurality of portions 18a-18d. Each of the portions 18a-18d may be a distinct portion that extends downwardly from the amplifier 14 and is separated from adjacent portions in one embodiment.

Conversely, on the bench 12, a plurality of bonding pads 20a-20d may be provided which extend upwardly and which are distinct and separate from their respective neighbors in one embodiment. In one embodiment, the bonding pads 20 and the bonding pads 18 are made of the same material, such as gold. However, the bonding pads 20a-20d have a stepped configuration such that the height of the pads 20a is higher than the pads 20b, which is higher than the pads 20c, which is higher than the pads 20d.

Thus, when the amplifier 14 is lowered onto the bench 12, one or more of the pads 18 makes physical contact with one or more of the pads 20. However, as shown in FIG. 1, there is no contact between any of the pads 18 or any of the pads 20 since the amplifier 14 and bench 12 are being positioned in the Y direction. The physical contact between particular pads 18 and 20 may also close an electrical switch 21 whose contacts are formed by the pads 18 and 20.

Thus, referring to FIG. 2, the pads 18 and 20 form a plurality of switches 21 (which are closed when the pads 18 make contact with their aligned pads 20). The switches 21 are shown in their open position because no contact has been established between pads 18 and 20 in FIG. 1. The switches 21a-21d in FIG. 2 are coupled to a contact 22a-22d. The contact 22 may be probed by a probing tool or other device to determine whether or not the switches 21 are open or closed.

Depending on which switches 21 are closed, the precise Y dimension orientation of the amplifier 14 and the bench 12, relative to one another, can be determined. In particular, since each pad 20 may have a different height in one embodiment, closure of any switch 21 indicates a relative spacing between the amplifier 14 and bench 12.

Figure 4:
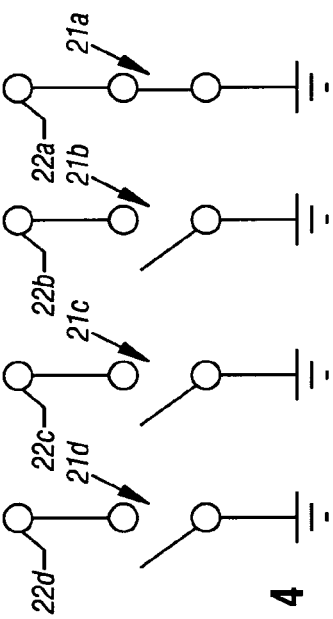
FIG. 4 is a schematic depiction of the embodiment shown in FIG. 3.

For example, referring to FIG. 3, the pad 18a has now made contact with the pad 20a, as indicated at B. Thus, referring to FIG. 4, the switch 21a is closed, but the other switches 21 remain open. As indicated at A', the waveguide portions 16a and 16b are still not precisely aligned.

Figure 5:
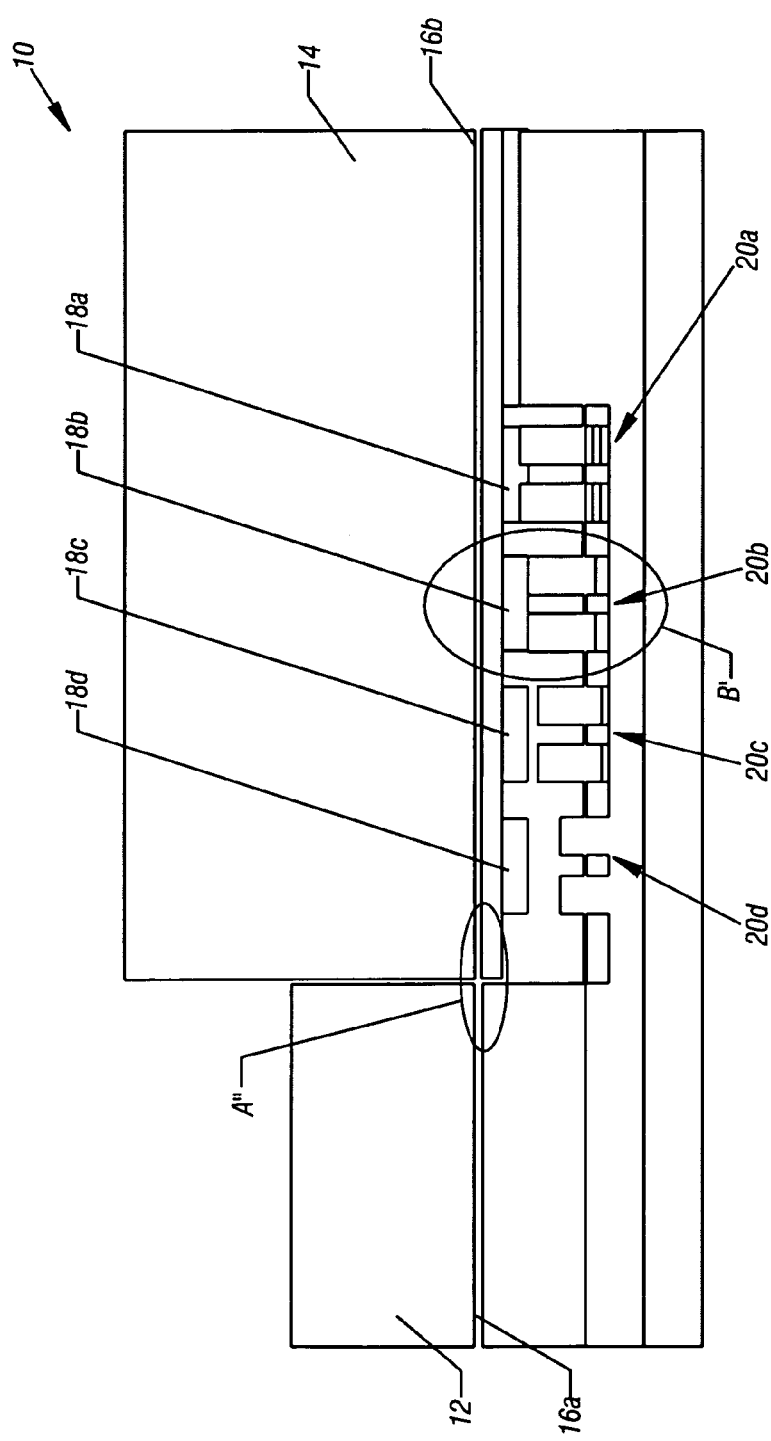
FIG. 5 is an enlarged, cross-sectional view of still another embodiment of the present invention.
Figure 6:
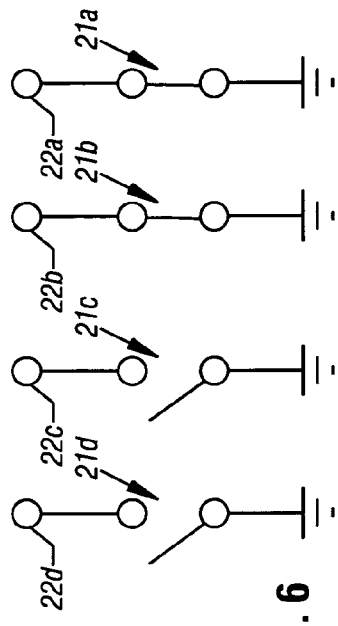
FIG. 6 is a schematic depiction of the embodiment shown in FIG. 5.

Referring to FIG. 5, after further displacement in the Y dimension, the pad 18b now also contacts the pad 20b, as shown in B'. To achieve this result, the pad 18a may be deformed in one embodiment. In this position, the waveguide portions 16a and 16b are precisely aligned as shown at A". Here, the switches 21b and 21a are both closed and the switches 21c and 21d are both open as shown in FIG. 6. Thus, the precise relative positions in the Y dimension can be determined to any desired granularity. More or fewer switches 21 may be provided to achieve the desired results, with variations in their heights in units of 0.2 nm, for example, or any other value such as 0.05 nm or 0.5 nm as desired for the particular application.

The flip chip bonder has precise alignment in the X and Z coordinates. Through the provision of the switches 21, precise alignment can be obtained in the Y direction. Therefore, the precise positioning of the parts is possible on a real time basis in some embodiments of the present invention. Rapid, nondestructive screening and sorting may also be accomplished using for example a prober to determine the resistance of the switches after the bonding step has been completed.

In some embodiments, the switches 21 may be fabricated during wafer processing using combinations of masking and etching, dry or wet, and the same process steps as deposition, via etch, and the like. Resolution of the switches 21 may be defined by the thicknesses of the respective pads 18, 20. Since the pads 18 and 20 define the switches 21, a material to facilitate electrical contact (such as gold) may be provided on the facing surfaces of the pads 18 and 20.

During the bonding process, a metal on the amplifier 14 side may deform or shrink to enable bond establishment between the amplifier 14 and bench 12. The deformation stops when the bonding force is withdrawn. This action facilitates the connection of the bond pad 18 on the amplifier 14, connecting or shorting the switches 21 at different step heights. Depending on the degree of deformation or transformation of the pads 18 on the amplifier 14, more or fewer contacts may be closed. By measuring the resistance of the switches 21 after bonding, one can determine the distance (and/or deformation) in the Y dimension of the amplifier 14 relative to the bench 12.

The construction of the switches 21 can be reversed depending on the overall process sequence. Pads of different heights may be fabricated on the amplifier 14 and the mating pads may be provided on the bench 12 in another embodiment. The concept of the switches 21 can be extended to checking other critical bonding factors which determine coupling efficiency, such as bonding integrity, tilt angle, and rotation angle.

The Y-height can be determined immediately after bonding by checking the switches 21 using wafer probing. In cases where the bench is a wafer and multiple components are aligned using this method, the prober may provide a wafer map for sorting and the wafer map may reduce the cost of testing for bad bench/amplifier combinations 10, translating to lower cost of the overall product in some embodiments. With a continuity meter or prober communicating with the bonder, besides the X and Z coordinates, the real time Y-height bonding data can be fed back to the bonder for real time control. The feedback may facilitate the optical passive alignment and high volume production and, therefore, may further reduce manufacturing costs.

Figure 7:
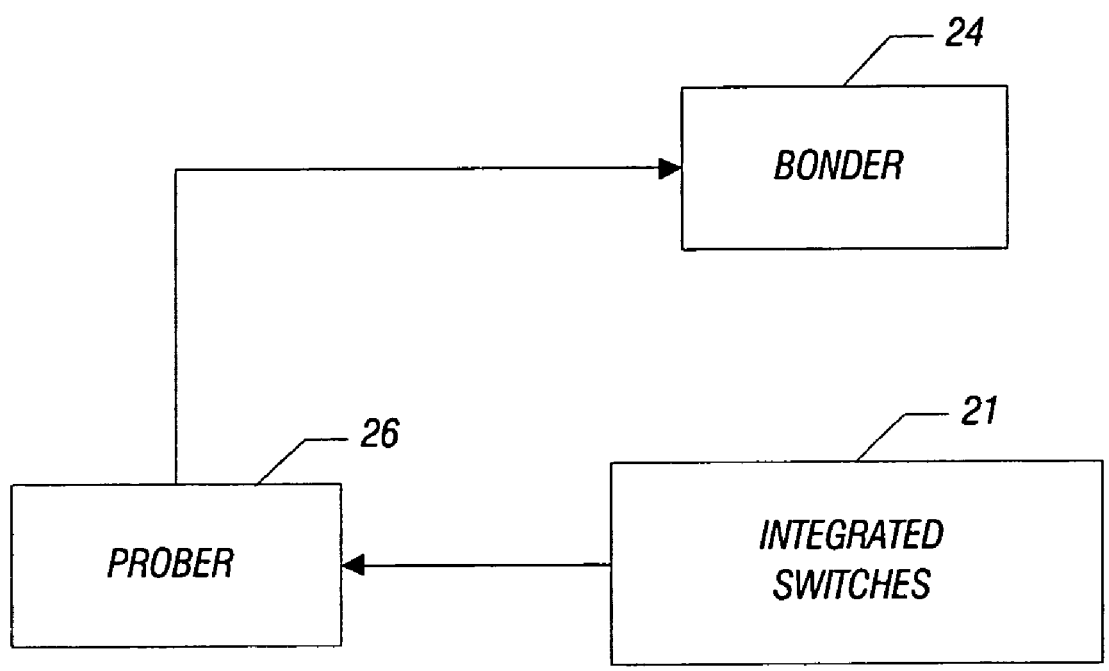
FIG. 7 is a schematic depiction of another embodiment.

Referring to FIG. 7, the amplifier 14 and bench 12 may be represented by integrated switches 21. Those switches 21 sense the distance between the amplifier 14 and the bench 12. That information may be read out by a wafer prober or continuity tester 26 using the contacts 22. The information about what switches 21 are open and closed may then be converted into a relative position in the Y direction. That information may then be provided by the prober 26 back to the bonder 24. The bonder 24 may then appropriately position the amplifier 14 and bench 12 based on the desired orientation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   aligning two optical components in two dimensions using a bonder; and
   using a surface feature on the two components to determine the position of said components relative to one another in a third dimension.

2. The method of claim 1 wherein said surface feature includes a stepped configuration having steps in said third dimension.

3. The method of claim 2 including detecting electrical connections between the stepped configuration on one component and contacts on another component.

4. The method of claim 3 including deforming at least one of said steps in order to contact another of said steps.

* * * * *